(12) United States Patent
Sommer

(10) Patent No.: US 7,428,282 B2
(45) Date of Patent: Sep. 23, 2008

(54) TIMING RECOVERY OF PAM SIGNALS USING BAUD RATE INTERPOLATION

(75) Inventor: Naftali Sommer, Rishon-Le-Zion (IL)

(73) Assignee: Texas Instruments Incorporated, Dallas, TX (US)

( * ) Notice: Subject to any disclaimer, the term of this patent is extended or adjusted under 35 U.S.C. 154(b) by 830 days.

(21) Appl. No.: 10/929,216

(22) Filed: Aug. 30, 2004

(65) Prior Publication Data

US 2005/0232383 A1 Oct. 20, 2005

Related U.S. Application Data

(60) Provisional application No. 60/562,394, filed on Apr. 15, 2004.

(51) Int. Cl.
*H03K 7/02* (2006.01)
(52) U.S. Cl. ...................... 375/353; 375/355
(58) Field of Classification Search ............... 375/222, 375/350, 225, 326, 355, 327; 708/290; 327/165
See application file for complete search history.

(56) References Cited

U.S. PATENT DOCUMENTS

| | | | | |
|---|---|---|---|---|
| 5,724,396 A | * | 3/1998 | Claydon et al. | 375/355 |
| 5,793,818 A | * | 8/1998 | Claydon et al. | 375/326 |
| 5,966,415 A | * | 10/1999 | Bliss et al. | 375/350 |
| 5,995,540 A | * | 11/1999 | Draganic | 375/222 |
| 6,111,920 A | * | 8/2000 | Alelyunas et al. | 375/326 |
| 6,665,336 B2 | * | 12/2003 | Abdelilah et al. | 375/225 |
| 6,753,712 B2 | * | 6/2004 | Saeki | 327/165 |
| 2003/0182335 A1 | * | 9/2003 | Conway et al. | 708/290 |
| 2004/0247049 A1 | * | 12/2004 | Maddux | 375/327 |

* cited by examiner

*Primary Examiner*—Chieh M. Fan
*Assistant Examiner*—Sudhanshu C. Pathak
(74) *Attorney, Agent, or Firm*—Steven A. Shaw; W. James Brady; Frederick J. Telecky, Jr.

(57) ABSTRACT

A timing recovery method enables interpolation of PAM signals sampled at baud rate. The method exploits the structure of the PAM signal and also the smoothness of the channel pulse response. The resulting interpolator is an adaptive linear filter; and its taps can be adapted with the LMS algorithm. Using this interpolator enables a user to significantly reduce the complexity of the analog clock control circuit. A Gigabit Ethernet receiver that controls the A/D clock by selecting one of several evenly space clock phases, for example, reduced the required number of clock phases from 64 to 16.

37 Claims, 2 Drawing Sheets

TIMING RECOVERY OF PAM SIGNALS USING BAUD RATE INTERPOLATION

RELATED PATENT APPLICATIONS

This application claims the benefit, under 35 U.S.C. §119 (e)(1), of U.S. Provisional Application Ser. No. 60/562,394, entitled Timing Recovery of PAM Signals Using Baud Rate Interpolation, filed Apr. 15, 2004 by Naftali Sommer, and incorporated by reference in its entirety herein.

BACKGROUND OF THE INVENTION

1. Field of the Invention

This invention relates generally to communication techniques, and more particularly to a method of exploiting the structure of pulse amplitude modulation (PAM) communication signals in order to perform interpolation at baud-rate sampling.

2. Description of the Prior Art

The timing recovery function of a digital communications receiver has to perform modifications to the sampling instants of the analog-to digital (A/D) converter. The natural solution is to modify the clock signal that controls the A/D (e.g. by using a voltage controlled oscillator). This however, is an expensive solution; and it is usually preferred that the A/D will sample with a free-running clock, and timing modifications will be done by digital interpolation of the A/D output samples. Such interpolation is practical only if the sampling rate is high enough such that a data sample can be reconstructed from several neighboring samples. Fast digital data communications standards (such as Gigabit Ethernet) however, usually use baud rate sampling (one sample per symbol), which is below the Nyquist rate of the signal, and certainly cannot be used with standard interpolation techniques.

In view of the foregoing, it is highly desirable and advantageous to provide a technique for implementing timing recovery associated with a digital communications receiver using interpolation at baud-rate sampling rates such that only a simple and inexpensive control of the A/D clock is required.

SUMMARY OF THE INVENTION

The present invention is directed to a technique for implementing timing recovery associated with a digital communications receiver using interpolation at baud-rate sampling rates such that only a simple and inexpensive control of the A/D clock is required. The method exploits the structure of the PAM signal and also the smoothness of the channel pulse response. The resulting interpolator is an adaptive linear filter; and its taps can be adapted with the LMS algorithm. Using this interpolator enables a user to significantly reduce the complexity of the analog clock control circuit. A Gigabit Ethernet receiver that controls the A/D clock by selecting one of several evenly space clock phases, for example, reduced the required number of clock phases from 64 to 16.

In one aspect, a technique is provided to exploit the structure of pulse amplitude modulation communication signals in order to perform interpolation at baud-rate sampling.

In another aspect, a technique is provided to implement the timing recovery function of a digital communication receiver using digital interpolation such that only a simple and inexpensive control of the A/D clock is required.

According to one embodiment, a method of pulse amplitude modulation (PAM) signal timing recovery comprises the steps of:

sampling a PAM signal at baud rate;
measuring a timing error associated with the sampled PAM signal;
smoothing the timing error measurement;
calculating a required sampling instance in response to the smoothed timing error measurement;
generating a free running clock at the baud rate with multiple clock signals having equally spaced timing phases;
selecting the most appropriate clock phase in response to the required sampling instance for each sampled signal; and
interpolating the sampled PAM signal from one selected timing phase to another and reconstructing the PAM signal there from.

According to another embodiment, a method of pulse amplitude modulation (PAM) signal timing recovery comprises the steps of:

sampling a PAM signal at baud rate; and
interpolating the sampled PAM signal via an adaptive interpolator, such that the PAM signal is successfully reconstructed there from.

According to yet another embodiment, a signal timing recovery system comprises:

an analog to digital converter (A/D) operational to sample a pulse amplitude modulation (PAM) signal at baud rate;
a timing phase detector operational to measure a residual timing error associated with the sampled PAM signal;
a loop filter operational to smooth the residual timing error measurement;
a numerically controlled oscillator (NCO) operational to calculate a required sampling instance in response to the smoothed residual timing error measurement and to generate a clock at the baud rate there from; and
a linear adaptive interpolator operational in response to the clock to shift the sampled PAM signal from one timing phase to another and to reconstruct the PAM signal there from.

According to still another embodiment, a signal timing recovery system comprises:

sampling means for converting a pulse amplitude modulation (PAM) signal at baud rate to a digital signal;
means for measuring a residual timing error associated with the sampled PAM signal;
means for smoothing the residual timing error measurement;
means for calculating a required sampling instance in response to the smoothed residual timing error measurement and for generating a clock at the baud rate there from; and
means for shifting the sampled PAM signal from one timing phase to another in response to the clock and for reconstructing the PAM signal there from.

BRIEF DESCRIPTION OF THE DRAWINGS

Other aspects and features of the present invention and many of the attendant advantages of the present invention will be readily appreciated as the invention becomes better understood by reference to the following detailed description when considered in connection with the accompanying drawings in which like reference numerals designate like parts throughout the figures thereof and wherein.

While the above-identified drawing figures set forth alternative embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

Figure 1A:
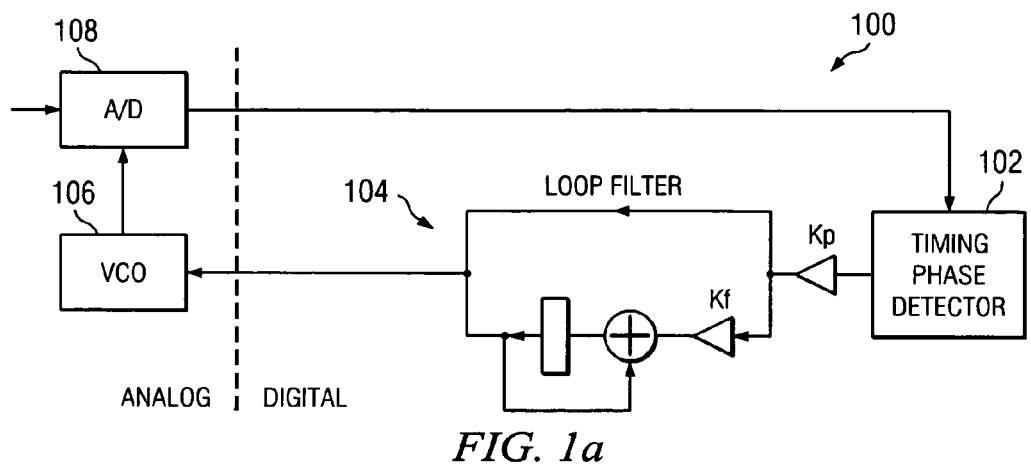
FIG. 1a illustrates a classical timing recovery function that employs direct A/D clock control.

In order to facilitate a better understanding of the preferred embodiments described herein below, a discussion is first presented with reference to FIG. 1a, FIG. 1b and FIG. 2, wherein FIG. 1a illustrates a classical timing recovery function structure 100 that employs direct A/D clock control. Consider first a pulse amplitude modulation (PAM) communication signal that is defined as:

$$x(t) = \sum_n a_n p(t - nT) \quad (1)$$

where $\{a_n\}$ are the data symbols (usually taken from a discrete constellation) and p(t) is the modulation pulse shape. The signal that reaches the receiver can be modeled as:

$$r(t) = \sum_n a_n h[t - nT - \tau(t)] \quad (2)$$

where h(t) is the total pulse shape (including the modulation pulse shape, the channel impulse response and the receiver analog front end impulse response), and $\tau(t)$ is the timing error. The timing error contains three main impairments: timing phase error, symbol rate mismatch and random jitter:

$$\tau(t) = \tau_0 + k \cdot t + \epsilon(t) \quad (3)$$

where $\tau_0$ is the timing phase error, k corresponds to the symbol rate mismatch and $\epsilon(t)$ is the random jitter.

Timing recovery is one of the most important functions in a digital communications receiver. This function has to compensate for the timing impairments mentioned above: it has to choose an optimal sampling phase for the analog-to-digital (A/D) converter. Also, it should track the random timing jitter (or at least its low frequency components). Finally, it should estimate and track the symbol rate mismatch of the received signal. The structure of the timing recovery function usually resembles a classical phase locked loop (PLL), and it consists of three main functional blocks. The first is a timing phase detector 102, that measures the timing error of the signal. The second is a loop filter 104, that smoothes this measurement. The third is a voltage-controlled oscillator (VCO) 106, which is an oscillator that modifies its output frequency according to the correction signal from the loop filter. The output of the VCO 106 is used to clock the A/D 108. The straightforward implementation of this structure actually uses a voltage-controlled oscillator 106 to clock the A/D 108, as shown in FIG. 1a. This structure however, is an expensive solution, and it is usually preferred that the A/D 108 will sample with a free-running clock, and the timing modifications will be done by digital interpolation of the A/D output samples, as shown in FIG. 1b.

Figure 1B:
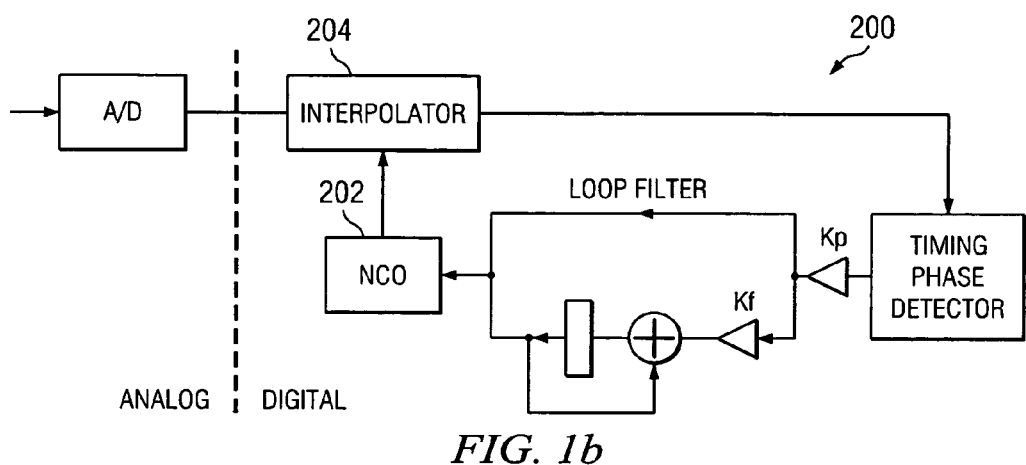
FIG. 1b illustrates a classical timing recovery function that employs digital interpolation of A/D output samples.

Looking now at FIG. 1b, a classical timing recovery function structure 200 is illustrated that employs digital interpolation of A/D output samples. The analog VCO 106 is replaced by a digital NCO (numerically controlled oscillator) 202 that calculates the required sampling instances. The interpolator 204 uses these values to modify the data samples as if they were originally sampled at the required instances. Possible interpolation methods can be, but are not limited to, polynomial interpolation (e.g. linear or cubic) or others (e.g. piecewise parabolic). Such interpolation however, is practical only if the sampling rate is high enough such that a data sample can be reconstructed from several neighboring samples. This usually implies a sampling rate that is significantly higher than the Nyquist rate of the signal; and for communication signals, it usually requires several samples per symbol. Fast digital data communication standards however, (such as Gigabit Ethernet) usually use baud rate sampling (one sample per symbol), which is below the Nyquist rate of the signal, and certainly cannot be used with standard interpolation techniques.

Figure 2:
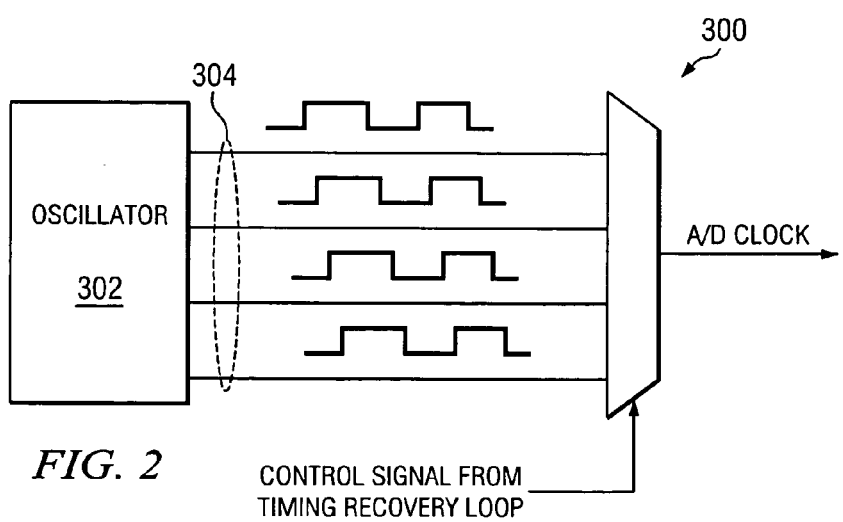
FIG. 2 illustrates an oscillator control circuit that employs an oscillator generating a free running clock with multiple clock signals having equally spaced timing phases.

A compromise solution for baud rate sampling systems, commonly used in Gigabit Ethernet transceivers is shown in FIG. 2. FIG. 2 illustrates an oscillator control circuit 300 that employs an oscillator 302 generating a free running clock with multiple clock signals 304 having equally spaced timing phases. In this solution, the oscillator 302 generates a free running clock at the required baud rate. However, as stated herein before, it generates multiple clock signals with equally spaced timing phases. For example, if 4 clock phases are generated (as shown in the example of FIG. 2), each clock signal is shifted in time by ¼ clock period relative to the previous clock signal. The timing recovery loop uses an NCO, as in FIG. 1b, and its quantized value simply chooses the most appropriate clock phase. This solution has two main drawbacks, compared with the analog VCO solution: timing phase is limited to a discrete number of possible clock phases, which results in additional residual timing error. Also, switching from one clock phase to another generates a discontinuity in timing phase. These drawbacks dictate the required number of phases. Regarding Gigabit Ethernet, for example, 64-128 clock phases are required for adequate performance. Regardless, this solution is much cheaper and simpler to implement than the analog VCO, and it can be easily integrated to system-on-a-chip silicon devices.

The present inventor alone recognized that the foregoing compromise solution can be improved by incorporating a baud-rate interpolator, as described herein below. The interpolator exploits two facts: the structure of the PAM signal and the fact that interpolation is only required between two adjacent clock phases, which means that the interpolated sample is relatively close to the given sample (the worst case distance is half the distance between adjacent clock phases). Using such an interpolator, the present inventor overcame the two drawbacks mentioned above and drastically reduced the number of required clock phases. The result is a very simple and cheap analog clock control scheme, with a very small increase in complexity of the digital part.

Baud Rate Interpolation: Exploiting the PAM Signal Structure

Figure 3:
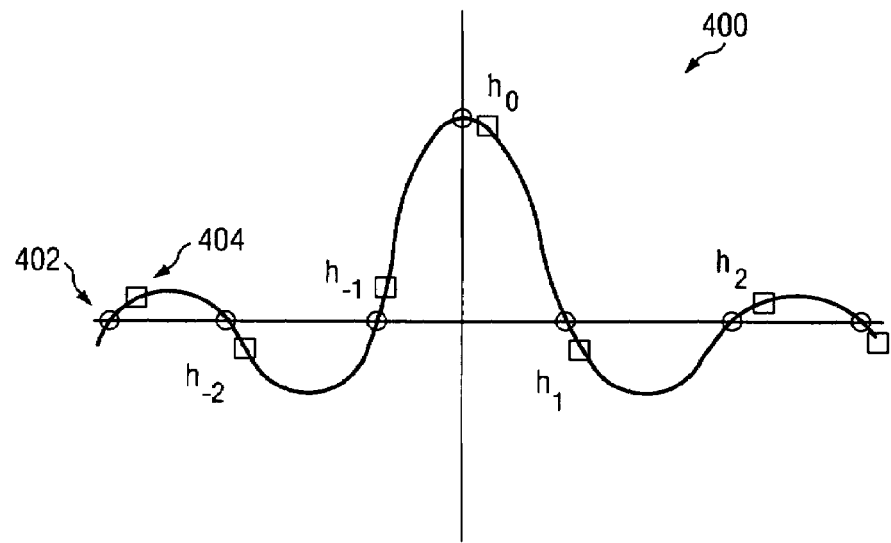
FIG. 3 is a waveform diagram illustrating a sampled total pulse shape associated with a sampled PAM signal at baud rate.

Suppose now that the received PAM signal represented by equation (2) is sampled at baud rate, i.e. at instances $t_k = kT$. Assume also for simplicity, that the only timing error is a fixed phase offset. Then:

$$r_k = r(kT) = \sum_n a_n h(kT - nT - \tau_0) = \sum_n a_n h_{k-n} \quad (4)$$

where $h_k \equiv h(kT-\tau_0)$ is the sampled total pulse shape. The result can be seen to be simply the convolution of the data symbols with the sampled pulse shape. FIG. 3 is a waveform diagram 400 illustrating how $h_k$ is generated from $h(t)$. The circles 402 and the squares 404 correspond to two different values of the timing phase $\tau_0$.

Now, suppose that a PAM signal is sampled at baud rate, and at some timing phase $\tau_0$ that generates the sampled pulse response $h_k \equiv h(kT-\tau_0)$. The signal is then:

$$r_n = \sum_k h_k a_{n-k} = h_n * a_n \quad (5)$$

where * denotes convolution. Now, suppose also that one desires to shift the signal to another timing phase $\tau_1$, for which the sampled channel response is $g_k \equiv h(kT-\tau_1)$. For example, $h_k$ may correspond to the circles 402 shown in FIG. 3 and $g_k$ may correspond to the squares 404. The required signal (after the desired shift) is then:

$$z_n = \sum_k g_k a_{n-k} = g_n * a_n \quad (6)$$

The relation between $r_n$ and $z_n$ is:

$$z_n = r_n * (h_n^{-1} * g_n) \quad (7)$$

since $r_n$ is first convolved with the inverse of $h_n$ to recover the symbols $a_n$, and then the result convolved with $g_n$ to get $z_n$. Therefore, $z_n$ can be recovered from $r_n$ by linear filtering; and this linear filter is exactly the interpolator that is desired:

$$f_n = h_n^{-1} * g_n \quad (8)$$

A linear filter therefore, has been found that can interpolate a PAM signal from one timing phase to another. Two reasons however, make this linear filter impractical: First, a different filter is needed for each timing phase. Second, note that the pulse response $h(t)$ is in general unknown in the receiver, since it depends on the unknown channel parameters (e.g. reflection amplitudes and delays). In order to calculate the filter coefficients it becomes necessary to know $g_n$, the sampled impulse response at the desired phase, while only the signal sampled at the phase that corresponds to $h_n$ is known.

The present inventor alone found solutions to the foregoing linear filter problems. These solutions are now discussed herein below in order to provide a better understanding of the preferred embodiments described herein. Regarding the first problem that requires a different filter for each timing pulse, assume now that the pulse response is smooth and the interpolated sample is relatively close to a given sample.

Exploiting the Smoothness of the Pulse Response for "Short Distance" Interpolation Now, suppose that $g_n$ and $h_n$ represent timing offsets that are close to each other, with a timing difference $\Delta\tau$. Assume also that the continuous time pulse shape $h(t)$ is smooth (i.e. has effective bandwidth that is much smaller than $1/\Delta\tau$). Then, a first order Taylor approximation can be employed to get:

$$g_n = h_n + \Delta\tau \cdot h'_n \quad (9)$$

where $h'_n$ is the derivative of the continuous time impulse response $h(t)$ (at the sampling points that correspond to $h_n$). Substituting in equation (8), the required interpolator is then:

$$f_n = h_n^{-1} * g_n = h_n^{-1} * (h_n + \Delta\tau \cdot h'_n) = \delta(n) + \Delta\tau \cdot (h_n^{-1} * h'_n) \quad (10)$$

Now, one only need calculate a single filter: $c_n = h_n^{-1} * h'_n$. In order to shift the given signal $r_n = h_n * a_n$ by $\Delta\tau$, $c_n$ is first scaled by $\Delta\tau$, and then an impulse is added to get the required interpolating filter $f_n$. Then $r_n$ is filtered with $f_n$ to get the desired shifted signal.

Interpretation of the Desired Interpolating Filter

The term $h_n^{-1} * h'_n$ has a simple interpretation when sampling above the Nyquist rate. When looking at the frequency domain, this term transforms to:

$$\frac{1}{H(w)} \cdot jwH(w) = jw \quad (11)$$

which simply means a digital derivative filter. Because however, the actual rate is below the Nyquist rate, the spectrum is folded and this relation (11) does not hold. Regardless, the interpolating filter $f_n$ described herein before can be interpreted as a generalized derivative filter.

Calculating the Interpolating Filter Taps

Figure 4:
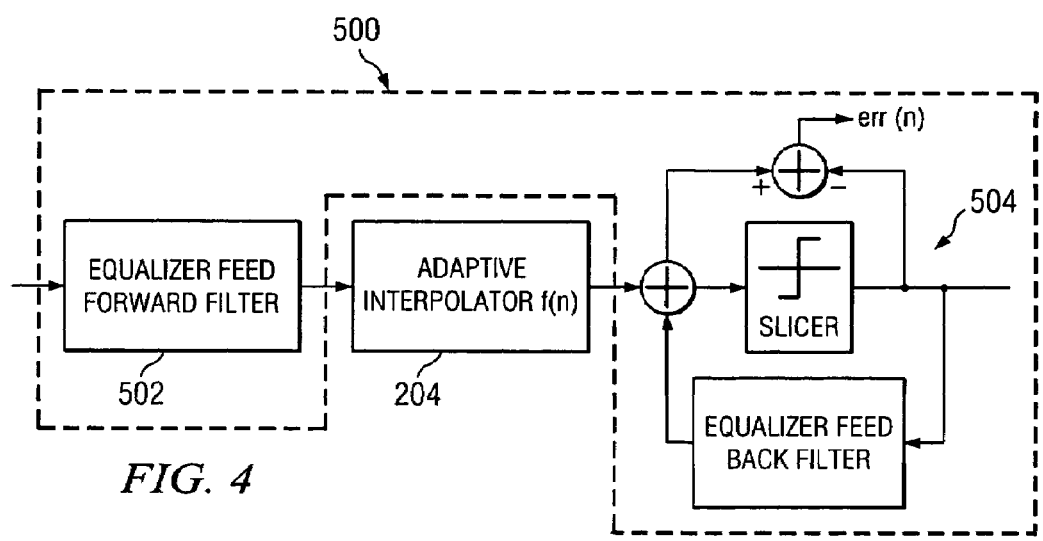
FIG. 4 is a block diagram illustrating and adaptive decision feedback equalizer in combination with an adaptive interpolator.

As stated herein before, $h_n^{-1} * h'_n$ is not known, or more particularly $h_n'$ is not known since the derivative information requires knowledge of the continuous-time pulse shape, and $h_n$ is only sampled at baud rate. The present inventor realized that the solution is simply to make the filter $c_n = h_n^{-1} * h'_n$ an adaptive FIR filter and adapt it with an LMS algorithm such as described by Edward A. lee and D. G. Messerschmitt, *Digital Communication*, second edition, Kluwer Academic Publishers, 1994. The interpolator 204 is assumed to be followed by a linear equalizer 502, which may be the feed-forward part of a decision feedback equalizer 500 such as shown in FIG. 4. The equalizer 502 removes the inter-symbol interference, and its output is fed to a decision device (the slicer) 504. The relative order of the interpolator 204 and the linear equalizer 502 can be changed such a seen in FIG. 4, since both are linear filters (In fact, the equalizer 502 could also perform the interpolation; however, its adaptation cannot be fast enough to track timing errors such as symbol rate mismatch). If it is assumed that the interpolator 204 is after the linear equalizer 502, as seen in FIG. 4, then its LMS adaptation is the same as that of the equalizer, with a slight modification: since the interpolation filter $f_n$ is not adapted directly, but instead $c_n$ is adapted, the LMS correction term is scaled by the factor that scales $c_n$ in the calculation of $f_n$, which is $\Delta\tau$. The resulting LMS equation is:

$$c_n^{(t+1)} = c_n^{(t)} - \mu \cdot err^{(t)} \cdot \Delta\tau^{(t)} \cdot r_{t-n} \quad (12)$$

where $\mu$ is the adaptation step size, $err^{(t)}$ is the slicer error at time t, $\Delta\tau^{(t)}$ is the residual timing error (the difference between the timing loop NCO and the timing generated by the selected clock phase), and $r_n$ is the interpolator input sample at time n.

The Adaptation Process

The adaptation of the interpolator has to be done with caution. First, note that the linear equalizer LMS adaptation is affected by the interpolation filter $f_n$ that follows it, since it will appear in the derivative of the error that is calculated by the LMS equations. In most cases however, the interpolator is close to an impulse, so this effect can be neglected.

In order to prevent collisions with the equalizer, the order of operation should be: (1) adapt equalizer with interpolator set to zero; (2) freeze equalizer and adapt interpolator; and (3) interpolator is frozen and not updated any more. An assumption is made that the equalizer can be adapted without the interpolator active, i.e. the slicer can make a reasonable percent of reliable decisions even before the interpolator is activated.

Singular situations may occur when symbol rate mismatch is very small, and the residual timing error is close to zero for all the period of the interpolator training. If this occurs, it cannot adapt. This situation can be resolved by forcing the clock phase quantizer to not choose the best possible clock phase, but instead to choose the second-best (only during interpolator adaptation). This technique will ensure a residual timing error of at least one clock phase period, and will assure successful interpolator adaptation.

An All-Digital Scheme

The clock generation scheme 300 depicted in FIG. 2 could be replaced with an all-digital scheme, where instead of 4 clock phases, there is but a single clock phase; and the interpolator is preceded by a filter bank of 4 different filters, corresponding to time shifts of 0, ¼, ½, and ¾ clock periods respectively. The filter bank can be adapted in a manner similar to the adaptation of the interpolator itself. Such a scheme however, may have "bootstrap" problems, because the slicer may not be able to make reliable decisions before the adaptation of the filter bank, and also not before the adaptation of the equalizer; so the adaptation process may not converge. This scheme may be useful if the pulse response h(t) is known (at least approximately) in advance.

Simulation Results

The present inventor simulated the adaptive interpolator $f_n$ with a Gigabit Ethernet receiver. Gigabit Ethernet uses a 5-PAM baseband signal with a symbol rate of 125 MHz. Ethernet ports must be very cost effective, and this usually forces use of baud rate sampling. The clock generation scheme 300 shown in FIG. 2 was employed, and the mean squared slicer error (MSE) was calculated. The MSE was also calculated for short time periods after clock phase transitions. The required signal to MSE ratio at the slicer input is about 18 dB for proper receiver operation, and for this specific design the signal to MSE ratio due to timing impairments, was allowed to be 35 dB in order for the total noise budget to be below the 18 dB requirement. Sixty-four (64) clock phases were required to achieve the desired performance without an adaptive interpolator. Adaptation time was about 10,000 symbols; and the required number of clock phases was reduced from 64 to 16 when an adaptive interpolator with 5 taps (processing delay of 2 symbols) was employed.

In summary explanation, a method was described to enable interpolation of PAM signals sampled at baud rate. The method exploits the structure of the PAM signal and also the smoothness of the channel pulse response. The resulting interpolator is an adaptive linear filter; and its taps can be adapted with the LMS algorithm. Using this interpolator enables a user to significantly reduce the complexity of the analog clock control circuit. A Gigabit Ethernet receiver that controls the A/D clock by selecting one of several evenly space clock phases, for example, reduced the required number of clock phases from 64 to 16.

In view of the above, it can be seen the present invention presents a significant advancement in the timing recovery function art associated with digital communication receivers. This invention has been described in considerable detail in order to provide those skilled in the digital communication receiver arts with the information needed to apply the novel principles and to construct and use such specialized components as are required. In view of the foregoing descriptions, it should be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow.

What is claimed is:

1. A method of signal timing recovery, the method comprising:

sampling a pulse amplitude modulation (PAM) signal at baud rate;

measuring a timing error associated with the sampled PAM signal;

smoothing the timing error measurement;

calculating a required sampling instance in response to the smoothed timing error measurement;

generating a free running clock at the baud rate with multiple clock signals having equally spaced timing phases;

selecting the most appropriate clock phase in response to the required sampling instance for each sampled signal comprising selecting the second-best clock phase when the timing error is close to zero during a complete interpolator training period, such that interpolator adaptation will be successful; and interpolating the sampled PAM signal from one selected timing phase to another and reconstructing the PAM signal there from.

2. The method according to claim 1, wherein interpolating comprises filtering each selected sample via an adaptive finite impulse response (FIR) filter.

3. The method according to claim 2, wherein interpolating further comprises adapting the FIR filter with a least mean squares calculation.

4. The method according to claim 1, further comprising removing inter-symbol interference prior to interpolating the sampled PAM signal.

5. The method according to claim 4, wherein removing inter-symbol interference comprises linear filtering each sampled PAM signal.

6. The method according to claim 5, wherein the linear filtering is implemented via a linear adaptive equalizer.

7. The method according to claim 6, further comprising non-linear filtering the interpolated signal.

8. The method according to claim 7, wherein the non-linear filtering is implemented via an adaptive decision feedback equalizer.

9. The method according to claim 1, further comprising removing inter-symbol interference subsequent to interpolating the sampled PAM signal.

10. The method according to claim 9, wherein removing inter-symbol interference comprises linear filtering each sampled PAM signal.

11. The method according to claim 10, wherein the linear filtering is implemented via a linear adaptive equalizer.

12. The method according to claim 11, wherein the adaptive equalizer is adapted only when the interpolation is inactive, and further wherein the interpolation is adapted only subsequent to adaptation of the equalizer and only when the equalizer is inactive, and further wherein the interpolation is frozen subsequent to its adaptation.

13. The method according to claim 10, further comprising non-linear filtering the interpolated signal.

14. The method according to claim 13, wherein the non-linear filtering is implemented via an adaptive decision feedback equalizer.

15. A method of signal timing recovery, the method comprising:

sampling a pulse amplitude modulation (PAM) signal at baud rate;

interpolating the sampled PAM signal via an adaptive interpolator, such that the PAM signal is successfully reconstructed there from;

generating a free running clock at the baud rate with multiple clock signals having equally spaced timing phases;

measuring a timing error associated with the sampled PAM signal;

smoothing the timing error measurement;

calculating a required sampling instance in response to the smoothed timing error measurement; and selecting the most appropriate clock phase in response to the required sampling instance for each sampled signal, such that the adaptive interpolator shifts the sampled PAM signal in response to the most appropriate clock phase comprising selecting the second-best clock phase when the timing error is close to zero during a complete interpolator training period, such that interpolator adaptation will be successful.

16. The method according to claim 15, wherein interpolating comprises filtering each selected sample via an adaptive finite impulse response (FIR) filter.

17. The method according to claim 16, wherein interpolating further comprises adapting the FIR filter with a predetermined least mean squares algorithm.

18. The method according to claim 15, further comprising removing inter-symbol interference prior to interpolating the sampled PAM signal.

19. The method according to claim 18, wherein removing inter-symbol interference comprises linear filtering each sampled PAM signal.

20. The method according to claim 19, wherein the linear filtering is implemented via a linear adaptive equalizer.

21. The method according to claim 20, further comprising non-linear filtering the interpolated signal.

22. The method according to claim 21, wherein the non-linear filtering is implemented via an adaptive decision feedback equalizer.

23. The method according to claim 15, further comprising removing inter-symbol interference subsequent to interpolating the sampled PAM signal.

24. The method according to claim 23, wherein removing inter-symbol interference comprises linear filtering each sampled PAM signal.

25. The method according to claim 24, wherein the linear filtering is implemented via a linear adaptive equalizer.

26. The method according to claim 25, wherein the adaptive equalizer is adapted only when the interpolation is inactive, and further wherein the interpolation is adapted only subsequent to adaptation of the equalizer and only when the equalizer is inactive, and further wherein the interpolation is frozen subsequent to its adaptation.

27. The method according to claim 25, further comprising non-linear filtering the interpolated signal.

28. The method according to claim 27, wherein the non-linear filtering is implemented via an adaptive decision feedback equalizer.

29. A signal timing recovery system comprising:

an analog to digital converter (A/D) operational to sample a pulse amplitude modulation (PAM) signal at baud rate;

a timing phase detector operational to measure a residual timing error associated with the sampled PAM signal;

a loop filter operational to smooth the residual timing error measurement;

a numerically controlled oscillator (NCO) operational to calculate a required sampling instance in response to the smoothed residual timing error measurement and to generate a clock at the baud rate there from; and a linear adaptive interpolator operational in response to the clock to shift the sampled PAM signal from one timing phase to another and to reconstruct the PAM signal there from and operational to select a second-best clock phase when the residual timing error is close to zero during a complete interpolator training period, such that an interpolator adaptation will be successful.

30. The signal timing recovery system according to claim 29, wherein the linear adaptive interpolator comprises an adaptive finite impulse response (FIR) filter operational to filter each selected sample.

31. The signal timing recovery system according to claim 30, wherein the linear adaptive interpolator is further operational in response to a predetermined least mean squares algorithm to shift each filtered PAM signal sample.

32. A signal timing recovery system comprising:

sampling means for converting a pulse amplitude modulation (PAM) signal at baud rate to a digital signal;

means for measuring a residual timing error associated with the sampled PAM signal;

means for smoothing the residual timing error measurement;

means for calculating a required sampling instance in response to the smoothed residual timing error measurement and for generating a clock at the baud rate there from;

means for shifting the sampled PAM signal from one timing phase to another in response to the clock and for reconstructing the PAM signal there from; and means for linear adaptive interpolating to select a second-best clock phase when the residual timing error is close to zero during a complete interpolator training period, such that an interpolator adaptation will be successful.

33. The signal timing recovery system according to claim 32, wherein the sampling means comprises an analog to digital converter.

34. The signal timing recovery system according to claim 32, wherein the means for measuring a residual timing error comprises a timing phase detector.

35. The signal timing recovery system according to claim 32, wherein the means for smoothing the residual timing error measurement comprises a loop filter.

36. The signal timing recovery system according to claim 32, wherein the means for calculating a required sampling instance in response to the smoothed residual timing error measurement and for generating a clock at the baud rate there from comprises a numerically controlled oscillator.

37. The signal timing recovery system according to claim 32, wherein the means for linear adaptive interpolating comprises an adaptive finite impulse response filter operational in response to a predetermined least mean squares algorithm.

* * * * *